United States Patent
Verghese et al.

(10) Patent No.: US 7,923,073 B2
(45) Date of Patent: *Apr. 12, 2011

(54) AMPHIPHILIC BLOCK COPOLYMER-TOUGHENED EPOXY RESINS AND ELECTRICAL LAMINATES MADE THEREFROM

(75) Inventors: Kandathil E. Verghese, Lake Orion, MI (US); Robert L. Hearn, Lake Jackson, TX (US)

(73) Assignee: Dow Global Technologies LLC

( * ) Notice: Subject to any disclaimer, the term of this patent is extended or adjusted under 35 U.S.C. 154(b) by 208 days.

This patent is subject to a terminal disclaimer.

(21) Appl. No.: 11/663,802

(22) PCT Filed: Nov. 2, 2005

(86) PCT No.: PCT/US2005/039963
§ 371 (c)(1),
(2), (4) Date: Oct. 29, 2007

(87) PCT Pub. No.: WO2006/052727
PCT Pub. Date: May 18, 2006

(65) Prior Publication Data
US 2008/0213489 A1    Sep. 4, 2008

Related U.S. Application Data

(60) Provisional application No. 60/626,611, filed on Nov. 10, 2004.

(51) Int. Cl.
*B05D 3/02* (2006.01)
(52) U.S. Cl. ........................................................ 427/386
(58) Field of Classification Search .......................... None
See application file for complete search history.

(56) References Cited

U.S. PATENT DOCUMENTS

| | | | |
|---|---|---|---|
| 3,662,030 A * | 5/1972 | Wu | 558/105 |
| 3,804,735 A | 4/1974 | Radlove et al. | |
| 3,892,819 A | 7/1975 | Najvar | |
| 3,948,698 A | 4/1976 | Elrick et al. | |
| 4,014,771 A | 3/1977 | Rosenkranz et al. | |
| 4,119,609 A | 10/1978 | Allen et al. | |
| 4,431,782 A | 2/1984 | Harris et al. | |
| 6,613,839 B1 | 9/2003 | Gan et al. | |
| 6,710,139 B2 * | 3/2004 | Hoyles et al. | 525/533 |
| 2004/0247881 A1 * | 12/2004 | Dean et al. | 428/413 |

FOREIGN PATENT DOCUMENTS

JP    H9-324110    12/1997

OTHER PUBLICATIONS

Journal of Polymer Science, Part B: Polymer Phusics, 2001, 39 (23), 2996-3010.
Journal of The American Chemical Society, 1997, 119(11), 2749-2750.
Macromolecules, 2000, 33 (26), 9522-9534.
Journal of Applied Polymer Science, 1994, 54, 815.
Macromolecules 2000, 33, 5235-5244.
Macromolecules, 2002, 35, 3133-3144.
Whitmarsh, R.H., In Nonionic Surfactants Polyoxylalkylene Block Copolymers; Nace, V.M., Ed.; Surfactant Science Series; vol. 60; Marcel Dekker, N.Y., 1996, Chapter 1.
Lee and Neville, Handbook of Epoxy Resins, Chapter 2, McGraw Hill, N.Y., 1967.

* cited by examiner

Primary Examiner — Erma Cameron

(57) ABSTRACT

A curable laminate epoxy composition comprising (a) an epoxy resin; (b) an amphiphilic block copolymer containing at least one epoxy resin miscible block segment and at least one epoxy resin immiscible block segment; wherein the immiscible block segment comprises at least one polyether structure provided that the polyether structure of said immiscible block segment contains at least one or more alkylene oxide monomer units having at least four carbon atoms; such that when the epoxy resin composition is cured, the toughness of the resulting cured epoxy resin composition is increased; (c) a curing agent; and (d) a curing catalyst. The amphiphilic block copolymer is preferably an all polyether block copolymer such as a PEO-PBO diblock copolymer or a PEO-PBO-PEO triblock copolymer.

22 Claims, No Drawings

AMPHIPHILIC BLOCK COPOLYMER-TOUGHENED EPOXY RESINS AND ELECTRICAL LAMINATES MADE THEREFROM

CROSS REFERENCE TO RELATED APPLICATION

This application is a 371 of PCT/US2005/039963 filed Nov. 2, 2005, which claims the benefit of U.S. Provisional Application Ser. No. 60/626,611 filed Nov. 10, 2004.

The present invention relates to epoxy resin laminate compositions modified with amphiphilic polyether block copolymers to increase the fracture resistance or toughness of the cured laminate composition; and to laminates made from the block copolymer modified compositions.

Epoxy resins are one class of thermosetting resins known to be useful for electrical laminate applications. The epoxy resins are typically used with a reinforcing substrate such as glass fibers and the combination is usually cured with hardeners or curing agents. When cured, the epoxy resins are known for their thermal and chemical resistance; and the cured resins also display good mechanical properties. However, the epoxy resins lack toughness and tend to be very brittle upon cure. The lack of toughness of the resins is especially true as the crosslink density or Tg of the resins increases. The lack of toughness of the resins is a disadvantage in laminate applications because laminates, particularly laminates used in printed circuit boards (PCBs), need to be tough enough to withstand drilling; and resins that are brittle can easily crack or craze during the drilling process.

Electrical laminates are composites typically made of an epoxy resin impregnated with a glass fiber reinforcing substrate; and are used as the primary support for PCBs. Currently, epoxy resins supplied to the electrical laminates industry are excellent at providing a substrate for electrical traces and electronic components. However, rapid advances within the electronic industry and increased regulatory pressure to remove lead from solder has resulted in the need for more temperature resistant resins systems. The prior art resin systems are inherently brittle which causes problems during PCB processing and drilling. Improved toughness in these resin systems will enhance processing and improve durability and reliability of the PCB. Accordingly, there is still a need to increase or enhance the toughness of the epoxy resin used in electrical laminates applications so that the laminate can withstand rigorous PCB processing conditions, while maintaining all of the other crucial properties of the resin such as modulus and Tg.

Recently, there have been several studies related to increasing the fracture resistance or toughness of epoxy resins by adding to the epoxy resin various block copolymers. Much of the previous work is focused on the use of amphiphilic diblock copolymers having an epoxy miscible block and an epoxy immiscible block in which the epoxy miscible block is poly(ethylene oxide) (PEO) and the immiscible block is a saturated polymeric hydrocarbon. Although effective at providing templated epoxies with appealing property sets, the known block copolymer materials are too expensive to be used in some applications.

For example, Journal of Polymer Science, Part B: Polymer Physics, 2001, 39(23), 2996-3010 describes the use of a poly(ethylene oxide)-b-poly(ethylene-alt-propylene) (PEO-PEP) diblock copolymer to provide micellar structures in cured epoxy systems; and that block copolymers self-assembled into vesicles and spherical micelles can significantly increase the fracture resistance of model bisphenol A epoxies cured with a tetrafunctional aromatic amine curing agent. And, Journal of the American Chemical Society, 1997, 119(11), 2749-2750 describes epoxy systems with self-assembled microstructures brought using amphiphilic PEO-PEP and poly(ethylene oxide)-b-poly(ethyl ethylene) (PEO-PEE) diblock copolymers. These block copolymer containing-systems illustrate characteristics of self-assembly.

Other block copolymers incorporating an epoxy-reactive functionality in one block have been used as modifiers for epoxy resins to achieve nanostructured epoxy thermosets. For example, Macromolecules, 2000, 33(26) 9522-9534 describes the use of poly(epoxyisoprene)-b-polybutadiene (BIxn) and poly(methylacrylate-co-glycidyl methacrylate)-b-polyisoprene (MG-I) diblock copolymers that are amphiphilic in nature and are designed in such a way that one of the blocks can react into the epoxy matrix when the resin is cured. Also, Journal of Applied Polymer Science, 1994, 54, 815 describes epoxy systems having submicron scale dispersions of poly(caprolactone)-b-poly(dimethylsiloxane)-b-poly(caprolactone) triblock copolymers.

While some of the previously known diblock and triblock copolymers mentioned above are useful for improving the toughness of epoxy resins, the preparation of such previously known block copolymers is complicated. The previously known block copolymers require multiple steps to synthesize and therefore are less economically attractive from a commercial standpoint.

Still other self-assembled amphiphilic block copolymers for modifying thermosetting epoxy resins to form nanostructured epoxy thermosets are known. For example, Macromolecules, 2000, 33, 5235-5244, and Macromolecules, 2002, 35, 3133-3144, describe the addition of a poly(ethylene oxide)-b-poly(propylene oxide) (PEO-PPO) diblock and a poly(ethylene oxide)-b-poly(propylene oxide)-b-poly(ethylene oxide) (PEO-PPO-PEO) triblock to an epoxy cured with methylene dianiline, where the average size of the dispersed phase in the diblock-containing blends is of the order of 10-30 nm. And, a polyether block copolymer such as a PEO-PPO-PEO triblock is also known to be used with an epoxy resin as disclosed in Japanese Patent Application Publication No. H9-324110.

While some of the previously known diblock and triblock copolymers mentioned above are useful for improving the toughness of epoxy resins, there is still a need in the laminates industry to further enhance the toughness of the epoxy resin used in laminate applications while maintaining all other crucial properties of the resin.

It is therefore desired to provide an alternative block copolymer that is useful for improving the toughness of epoxy resins by a self assembly process without any of the disadvantages of the previously known block copolymers.

The present invention is directed to a curable epoxy resin laminate composition comprising
 (a) an epoxy resin;
 (b) an amphiphilic polyether block copolymer containing at least one epoxy resin miscible block segment and at least one epoxy resin immiscible block segment; wherein the immiscible block segment comprises at least one polyether structure; such that when the epoxy resin composition is cured, the toughness of the resulting cured epoxy resin composition is increased;
 (c) a curing agent; and
 (d) a curing catalyst.

One embodiment of the present invention is directed to an epoxy resin modified with an amphiphilic polyether block copolymer containing an immiscible block segment comprising at least one polyether structure provided that the polyether structure of said immiscible block segment contains at least one or more alkylene oxide monomer units having at least four carbon atoms.

One embodiment of the present invention is directed to an epoxy resin modified with an amphiphilic polyether block copolymer containing at least one epoxy resin miscible block segment and at least one epoxy resin immiscible block segment; wherein both the miscible block segment and the immiscible block segment comprises at least one polyether structure.

Another embodiment of the present invention is directed to an epoxy resin modified with an amphiphilic polyether block copolymer containing at least one epoxy resin miscible block segment and at least one epoxy resin immiscible block segment; wherein both the miscible block segment and the immiscible block segment comprises at least one polyether structure.

By the addition of a small amount (for example, from 1-5 weight percent) of an amphiphilic block copolymer to an epoxy resin, a second phase morphology is created that is at the nano-scale (15-25 nanometers) due to self assembly that imparts tremendous improvements in toughness and ductility to epoxy electrical laminate resins without adversely affecting other properties such as glass transition, moisture resistance, and thermal resistance. These features are particularly useful in electrical laminate applications where there is a continued need for increase temperature resistance both from the extended PCB (printed circuit board) processing time required for higher layer count boards and the advent of lead free solder. To achieve this improved temperature resistance modified resins and higher crosslinked systems are being used.

The resins are modified by adding an amount of an amphiphilic block copolymer (preferably one which has an elastomeric polymer as one of the components) sufficient for the block copolymer to self assemble in the host epoxy resin on a nanometer size scale. The copolymer may be added at any time during the processing of the epoxy resin. If the final epoxy product is a blend of several epoxies and solvents, the copolymer can be added during the blending process. The addition of the copolymer to these systems reduces the brittleness of the resin systems which improves process ability and reliability of the PCB. These copolymers all used in epoxy resins that are, in turn, used in the manufacture of electrical laminates that ultimately will be used to produce PCBs.

Some of the beneficial features of using the amphiphilic polyether block copolymer of the present invention to toughen resins include, for example: (1) the self assembly characteristics of the amphiphilic block copolymer, (2) the ability of the block copolymer to assemble at a nanometer length scale, (3) the ability of the block copolymer to create a very uniform dispersion across the entire resin monomer matrix, and (4) the ability to use low loading levels of the block copolymer toughening agent to achieve toughening results.

Some of the advantages of using the amphiphilic polyether block copolymer of the present invention include, for example: (1) the ability of the block copolymer to improve toughness of the host resin without adversely affecting other key properties such as glass transition temperature, modulus and viscosity of the host resin, (2) the ability of the resin to retain certain aesthetic qualities such as appearance that is crucial in certain applications, and (3) the ability to consistently and reproducibly create morphology prior to or during the curing of the resin itself.

The present invention includes a laminate composition with improved toughness comprising an epoxy resin monomer system modified with an amphiphilic block copolymer, such as a polyether block copolymer, as a toughening agent for the resin system. These modified epoxy resins, when cured, show impressive improvements in fracture toughness (defined by $K_{1c}$) with only minor changes in modulus and glass transition temperature (Tg) behavior.

Templated thermoset epoxy polymers with nanoscale self-assembled morphologies, exhibit an attractive combination of improved toughness and retention of material properties such as modulus and Tg. The epoxy thermoset polymers can be prepared, for example, by dispersing an amphiphilic block copolymer in a resin monomer matrix, where the copolymer can undergo self-assembly, and then curing the resin. Self-assembled resins that exhibit surfactant-like morphologies provide enhanced fracture toughness at very low (for example, from 1 weight percent to 5 weight percent) block copolymer loadings. Amphiphilic block copolymers that are capable of self assembly when mixed with the resin monomer must have at least one block that is miscible with the resin/curing agent mixture prior to cure, and at least one block that is immiscible with the resin/curing agent mixture prior to cure.

One embodiment of the present invention is aimed at preparing an all polyether block copolymer, for example, a diblock copolymer, such as those based on poly(ethylene oxide)-b-(butylene oxide) (PEO-PBO), that self assembles in thermosetting resins, such as epoxy resin systems. At sufficiently high butylene oxide block lengths (for example, Mn=1000 or greater) these block structures are found to be effective at templating the resin monomer into micellar structures such as spherical micelles.

The amphiphilic polyether block copolymer useful in the present invention may include any block copolymer containing an epoxy resin miscible block segment comprising at least one polyether structure; and an epoxy resin immiscible block segment comprising at least one polyether structure.

Preferably, the amphiphilic polyether block copolymer useful in the present invention includes one or more polyether block copolymers comprising at least one epoxy miscible polyether block segment derived from an alkylene oxide such as ethylene oxide (EO) and at least one epoxy immiscible polyether block segment derived from an alkylene oxide with at least greater than 3 carbon atoms, for example 1,2-epoxy butane known commonly as butylene oxide (BO). The immiscible block segment may also be comprised of mixtures of $C_4$ or higher carbon analogue monomers that are copolymerized together to provide the immiscible block segment. The immiscible block may also contain lower molecular weight co-monomers such as EO. The polyether block copolymer contains at least one epoxy resin miscible polyether block segment, E, and at least one epoxy resin immiscible polyether block segment, M.

The present invention polyether block copolymer component may contain at least two or more amphiphilic polyether block copolymer segments. Examples of the amphiphilic polyether block copolymer may be selected from the group consisting of a diblock (EM); a linear triblock (EME or EME); a linear tetrablock (EMEM); a higher order multiblock structure $(EMEM)_xE$ or $(MEME)_xM$, where X is an integer value ranging from 1-3; a branched block structure; or a star block structure; and any combination thereof. The amphiphilic polyether block copolymer consisting of the branched block structures or star block structures contains at least one epoxy monomer miscible block and at least one epoxy monomer immiscible block.

Examples of the epoxy resin miscible polyether block segment, E, include a polyethylene oxide block, a propylene oxide block, a poly(ethylene oxide-co-propylene oxide) block, a poly(ethylene oxide-ran-propylene oxide) block and mixtures thereof. Preferably, the epoxy resin miscible polyether block segment useful in the present invention is a polyethylene oxide block.

Generally, the ester resin immiscible polyether block segment, M, useful in the present invention is an epoxidized alpha olefin having a carbon atom of from $C_4$ to $C_{20}$. Examples of the epoxy resin immiscible polyether block segment, M, include a polybutylene oxide block, a polyhexylene oxide block derived from 1,2 epoxy hexane, a polydodecylene oxide block derived from 1,2-epoxy dodecane, and mixtures thereof. Preferably, the epoxy resin immiscible polyether block segment useful in the present invention is a polybutylene oxide block.

In another embodiment of the present invention, when the polyether block copolymer has a multiblock copolymer structure, other block segments in addition to E and M may be present in the block copolymer. Examples of other miscible segments of the block copolymer include polyethylene oxide, polymethyl acrylate, and mixtures thereof. Examples of other immiscible segments of the block copolymer include polyethylene propylene (PEP), polybutadiene, polyisoprene, polydimethyl siloxane, polybutylene oxide, polyhexylene oxide, polyalkyl methyl methacrylate, such as polyethyl hexyl methacrylate, and mixtures thereof.

The amphiphilic polyether block copolymers which can be employed in the practice of the present invention include for example, but are not limited to, a diblock copolymer, a linear triblock, a linear tetrablock, a higher order multiblock structure, a branched block structure, or star block structure. For example, the polyether block copolymer may contain a poly(ethylene oxide) block, a poly(propylene oxide) block or a poly(ethylene oxide-co-propylene oxide) block; and an alkylene oxide block based on a $C_4$ or higher carbon analog block, such as, for example, 1,2-epoxybutane, 1,2-epoxyhexane, 1,2-epoxydodecane, or 1,2-epoxyhexadecane block. Other examples of the alkylene oxide blocks may include Vikolox™ epoxidized alpha olefins, including C10-C30+ olefins, commercially available from Atofina.

Preferred examples of suitable block copolymers useful in the present invention include amphiphilic polyether diblock copolymers such as, for example, poly(ethylene oxide)-b-poly(butylene oxide) (PEO-PBO) or amphiphilic polyether triblock copolymers such as, for example, poly(ethylene oxide)-b-poly(butylene oxide)-b-poly(ethylene oxide) (PEO-PBO-PEO).

The amphiphilic polyether block copolymer used in the present invention can have a number average molecular weight (Mn) of from 1,000 to 30,000, for the combination of both block lengths. Most preferably, the molecular weight of the polyether block copolymer is between 3,000 and 20,000. Prior art materials derived from block copolymers in which the immiscible block has a very low solubility parameter (polymeric hydrocarbons) microphase separate prior to cure. The polyether containing block structures of the present invention, on the other hand, can either be microphase separated prior to cure at the preferred molecular weights, or form micelles while the curing process is being performed.

The composition of the block copolymer can range from 90 percent epoxy resin miscible polyalkylene oxide block and 10 percent epoxy resin immiscible polyalkylene oxide block to 10 percent epoxy resin miscible polyalkylene oxide block and 90 percent epoxy resin immiscible polyalkylene oxide block.

Small amounts of homopolymers from each of the respective block segments may be present in the final amphiphilic polyether block copolymer of the present invention. For example, from 1 weight percent to 50 weight percent, preferably from 1 weight percent to 10 weight percent, of a homopolymer that is similar or identical in structure with the miscible or the immiscible block can be added to the composition of the present invention comprising a thermosetting monomer system and an amphiphilic polyether block copolymer.

The amount of amphiphilic polyether block copolymers employed in the epoxy resin composition of the present invention depends on a variety of factors including the equivalent weight of the polymers, as well as the desired properties of the products made from the composition. In general, the amount of amphiphilic polyether block copolymers employed in the present invention may be from 0.1 weight percent to 30 weight percent, preferably from 0.5 weight percent to 10 weight percent and, most preferably, from 1 weight percent to 5 weight percent, based on the weight of the resin composition.

The amphiphilic polyether block copolymers of the present invention preferably increase the toughness or fracture resistance of the epoxy resin, preferably at low loadings of block copolymer (for example less than 5 weight percent) in the epoxy resin composition. Generally, addition of from 1 wt percent to 5 wt percent of a polyether block copolymer to the epoxy resin composition increases the toughness of the composition by a factor of 1.5 times to 2.5 times that of a control.

The present invention thermosetting resin composition may contain at least one or more amphiphilic polyether block copolymers mixed with the thermosetting resin. In addition, two or more different amphiphilic block copolymers may be blended together to make up the block copolymer component of the present invention so long as one of the block copolymers is a polyether block copolymer. More than one block copolymer can be combined to gain additional control of the nanostructure, that is, shape and dimension.

In addition to the polyether block copolymer used in the resin composition, other aliphiphilic block copolymers may be used as a secondary block copolymer component in the resin composition of the present invention. Examples of additional amphiphilic block copolymers, other than the polyether block copolymers of the present invention, which can be employed in the practice of the present invention include for example, but are not limited to, poly(ethylene oxide)-b-poly(ethylene-alt propylene) (PEO-PEP), poly(isoprene-ethylene oxide) block copolymers (PI-b-PEO), poly(ethylene propylene-b-ethylene oxide) block copolymers (PEP-b-PEO), poly(butadiene-b-ethylene oxide) block copolymers (PB-b-PEO), poly(isoprene-b-ethylene oxide-b-isoprene) block copolymers (PI-b-PEO-PI), poly(isoprene-b-ethylene oxide-b-methylmethacrylate) block copolymers (PI-b-PEO-b-PMMA); and mixtures thereof. Generally, the amount of secondary amphiphilic block copolymer used in the resin composition may be from 0.1 weight percent to 30 weight percent.

The polyether block copolymers of the present invention provide uniformly dispersed and uniformly scaled nano-sized structures which preferably form (template) in the liquid resin matrix due to micellization brought about by the balance of immiscibility of one block segment and miscibility of the other block segment. The micellar structures are preserved into the cured epoxy thermoset, or form during the curing process, producing epoxy thermoset materials exhibiting improved toughness, improved fracture resistance, and improved impact resistance while maintaining Tg, modulus and other properties at the same level as the unmodified epoxy thermoset. The micellar morphology of the nano-templated resin can be for example, spherical, worm-like, and vesicles. Micellar morphologies are advantageously obtained at low (for example, less than 5 weight percent) concentrations of block copolymers; that is, the morphological features are not associated with one another or packed into a three dimensional lattice. At higher concentrations self-assembled structures can form spherical, cylindrical, or lamellar morphological features that are associated with one another by lattice interactions, also at a nanometer size scale.

It is believed that the increase in fracture resistance occurs when the block copolymers self-assemble into a nanoscale morphology such as worm-like, vesicles or spherical micelle morphology. While it is not well understood how to predict which micelle morphology, if any will occur in different resins, it is believed that some of the factors that determine the self-assembled morphology may include, for example, (i) the choice of monomers in the block copolymer, (ii) the degree of asymmetry in the block copolymer, (iii) the molecular weight of the block copolymer, (iv) the composition of the thermosetting resin, and (v) the choice of curing agent for the resin. Apparently, a nanoscale morphology plays an important role in creating toughness in a epoxy resin product of the present invention.

As an illustration of one embodiment of the present invention, an epoxy resin may be blended with a polyether block copolymer, for example, a poly(ethylene oxide)-b-poly(butylene oxide) (PEO-PBO) diblock copolymer wherein the PBO is the epoxy immiscible hydrophobic soft component of the diblock copolymer and the PEO is the epoxy miscible component of the diblock copolymer. The curable epoxy resin composition including the PEO-PBO diblock copolymer increases the impact resistance of the cured epoxy resin body.

The PEO-PBO block copolymer can be indicated generally by the chemical formula $(PEO)_x$-$(PBO)_y$ wherein the subscripts x and y are the number of monomer units of polyethylene oxide and polybutylene oxide in each block, respectively and are positive numbers. Generally, x should be from 15 to 85 and the molecular weight of the structural part $(PEO)_x$ should be from 750 to 100,000. Subscript y should be from 15 to 85 and the molecular weight represented by the structural part $(PBO)_y$ should be from 1,000 to 30,000. Also, a single PEO-PBO diblock copolymer may be used alone, or more than one PEO-PBO diblock copolymer may be combined to be used as well.

In one embodiment of the present invention, PEO-PBO diblock copolymer is used, wherein the diblock copolymer has 20 percent PEO and 80 percent PBO to 80 percent PEO and 20 percent PBO; and having block sizes of molecular weights (Mn) of PBO 2000 or higher and molecular weights of PEO 750 or higher; and provides various morphologies. For example, the present invention includes a diblock with a PBO block length of from 2,500 to 3,900 that provides spherical micelles. Another example of the present invention includes a diblock with a PBO segment of 6,400 that provides worm-like micelles. Still another example of the present invention is a diblock with a short (Mn=750) PEO block segment that provides an agglomerated vesicle morphology. Yet another example of the present invention includes a mixture of a PEO-PBO diblock with a low molecular weight PBO homopolymer that provides a spherical micelle in which the PBO homopolymer sequesters into the micelle without forming a separate macrophase; the PBO homopolymer macrophase separate; when added without the diblock present.

In general, the amphiphilic block copolymers used in the present invention can be prepared in a single sequential synthetic polymerization process, wherein one monomer is polymerized to prepare an initial block, followed by simple introduction of the second monomer type which is then polymerized onto the terminus of the first block copolymer until the polymerization process is complete. It is also possible to make the blocks separately, preparing the first block and then polymerizing the second block onto the terminus of the first block in a second synthetic step. The difference in solubility of the two block fragments is sufficient that the block copolymer may be used to modify a variety of epoxy materials.

The block copolymers can be prepared by Group I metals such as sodium, potassium or cesium moderated anionic polymerization. The polymerization can be carried out neat or using a solvent. The temperature of the polymerization reaction can be for example from 100° C. to 140° C. at atmospheric pressure to slightly above atmospheric pressure. The synthesis of the block copolymer may be carried out, for example, as described in Whitmarsh, R. H., In Nonionic Surfactants Polyoxyalkylene Block Copolymers; Nace, V. M., Ed.; Surfactant Science Series; Vol. 60; Marcel Dekker, N.Y., 1996; Chapter 1.

In a preferred embodiment, the block segments of the block copolymers are prepared by the ring-opening polymerization of 1,2-epoxy alkenes.

A thermoset material is defined as being formed of polymer chains of variable length bonded to one another via covalent bonds, so as to form a three-dimensional network. Thermoset epoxy materials can be obtained, for example, by reaction of a thermosetting epoxy resin with a hardener such as of an amine type, a phenolic, or an anhydride.

Epoxy resins useful in the present invention include a wide variety of epoxy compounds. Typically, the epoxy compounds are epoxy resins which are also referred to as polyepoxides. Polyepoxides useful herein can be monomeric (for example, the diglycidyl ether of bisphenol A, diglycidyl ether of tetrabromobisphenol A, novolac-based epoxy resins, and tris-epoxy resins), higher molecular weight advanced resins (for example, the diglycidyl ether of bisphenol A advanced with bisphenol A, diglycidyl ether of bisphenol A advanced with tetrabromobisphenol A, diglycidyl ether of tetrabromobisphenol A advanced with tetrabromobishphenol A) or polymerized unsaturated monoepoxides (for example, glycidyl acrylates, glycidyl methacrylate, allyl glycidyl ether, etc.), homopolymers or copolymers. Most desirably, epoxy compounds contain, on average, at least one pendant or terminal 1,2-epoxy group (that is, vicinal epoxy group) per molecule.

Other examples of epoxies useful in the present invention include flame retardant epoxies including phosphorus-containing epoxies and brominated epoxies as described in U.S. patent application Ser. No. 10/456,128.

Examples of useful polyepoxides include the polyglycidyl ethers of both polyhydric alcohols and polyhydric phenols; polyglycidyl amines; polyglycidyl amides; polyglycidyl imides; polyglycidyl hydantoins; polyglycidyl thioethers; epoxidized fatty acids or drying oils; epoxidized polyolefins; epoxidized di-unsaturated acid esters; epoxidized unsaturated polyesters; and mixtures thereof.

Numerous polyepoxides prepared from polyhydric phenols include those which are disclosed, for example, in U.S. Pat. No. 4,431,782. Polyepoxides can be prepared from mono-, di- and tri-hydric phenols, and can include the novolac resins. Polyepoxides can include the epoxidized cyclo-olefins; as well as the polymeric polyepoxides which are polymers and copolymers of glycidyl acrylate, glycidyl methacrylate and allylglycidyl ether. Suitable polyepoxides are disclosed in U.S. Pat. Nos. 3,804,735; 3,892,819; 3,948,698; 4,014,771 and 4,119,609; and Lee and Neville, Handbook of Epoxy Resins, Chapter 2, McGraw Hill, N.Y. (1967).

While the present invention is applicable to polyepoxides in general, preferred polyepoxides are glycidyl polyethers of polyhydric alcohols or polyhydric phenols having an epoxide equivalent weight (EEW) of from 150 to 3,000; preferably an EEW of from 170 to 2,000. These polyepoxides are usually made by reacting at least two moles of an epihalohydrin or glycerol dihalohydrin with one mole of the polyhydric alcohol or polyhydric phenol, and a sufficient amount of a caustic alkali to combine with the halohydrin. The products are characterized by the presence of more than one epoxide group, that is, a 1,2-epoxy equivalency greater than one.

The polyepoxide useful in the present invention can also be a cycloaliphatic diene-derived epoxide. These polyepoxides can be cured either thermally, cationically or photoinitiation (example UV initiated cure). There are several cycloaliphatic epoxides that are made and marketed by The Dow Chemical Company such as 3,4-epoxycyclohexylmethyl-3,4-epoxycyclohexyl carboxylate; 1,2-epoxy-4-vinylcyclohexane; bis(7-oxabicyclo[4.1.0]hept-3-ylmethyl hexanedioic acid ester; 3,4-epoxycyclohexanecarboxylate methyl ester; and mixtures thereof.

The polyepoxide may also include a minor amount of a monoepoxide, such as butyl and higher aliphatic glycidyl ethers, phenyl glycidyl ether, or cresyl glycidyl ether, as a reactive diluent. Such reactive diluents are commonly added to polyepoxide formulations to reduce the working viscosity thereof, and to give better wetting to the formulation. As is known in the art, a monoepoxide affects the stoichiometry of the polyepoxide formulation and adjustments are made in the amount of curing agent and other parameters to reflect that change.

Generally, the amount of polyepoxide used in the present invention may be in the range of from 20 weight percent to 99 weight percent.

The curing agent component (also referred to as a hardener or cross-linking agent) useful in the present invention may be any compound having an active group being reactive with the epoxy group of the epoxy resin. The chemistry of such curing agents is described in the previously referenced books on epoxy resins. The curing agent useful in the present invention includes nitrogen-containing compounds such as amines and their derivatives; oxygen-containing compounds such as carboxylic acid terminated polyesters, anhydrides, phenol-formaldehyde resins, brominated phenolic resins, amino-formaldehyde resins, phenol, bisphenol A and cresol novolacs, phenolic-terminated epoxy resins; sulfur-containing compounds such as polysulfides, polymercaptans; and catalytic curing agents such tertiary amines, Lewis acids, Lewis bases and combinations of two or more of the above curing agents.

Practically, polyamines, dicyandiamide, diaminodiphenylsulfone and their isomers, aminobenzoates, various acid anhydrides, phenol-novolac resins and cresol-novolac resins, for example, may be used in the present invention, but the present invention is not restricted to the use of these compounds.

Another embodiment of cross-linkers useful in the present invention are described in U.S. Pat. No. 6,613,839, and include, for example, copolymers of styrene and maleic anhydride having a molecular weight ($M_w$) in the range of from 1500 to 50,000 and an anhydride content of more than 15 percent.

Generally, the amount of curing agent used in the present invention may be in the range of from 1 weight percent to 80 weight percent.

Another component that is useful in the present invention is a curing catalyst which can also be added to the epoxy resin composition. Examples of curing catalyst include imidazole derivatives, tertiary amines, and organic metallic salts. Other examples of such curing catalysts include free radical initiators, such as azo compounds including azoisobutyronitrile, and organic peroxides, such as tertiary-butyl perbenzoate, tertiary-butyl peroctoate, and benzoyl peroxide; methyl ethyl ketone peroxide, acetoacetic peroxide, cumene hydroperoxide, cyclohexanone hydroperoxide, dicumyl peroxide, and mixtures thereof. Methyl ethyl ketone peroxide and benzoyl peroxide are preferably used in the present invention.

Generally, the curing catalyst is used in an amount of from 0.03 to 6 parts by weight based on the total weight of the curable composition, excluding the weight of any reinforcing particles that might be present in the composition.

An optional component useful in the curable resin composition of the present invention is a reaction inhibitor. The reaction inhibitor may include boric acid, Lewis acids containing boron such as alkyl borate, alkyl borane, trimethoxyboroxine, an acid having a weak nucleophilic anion, such as, perchloric acid, tetrafluoboric acid, and organic acids having a pKa from 1 to 3, such as, salicylic acid, oxalic acid and maleic acid. Boric acid, as used herein, refers to boric acid or derivatives thereof, including metaboric acid and boric anhydride; and combinations of a Lewis acid with boron salts such as alkyl borate or trimethoxyboroxine. When an inhibitor is used in the present invention, boric acid is preferably used. The inhibitor and catalyst may be separately added, in any order, to the curable epoxy resin composition of the present invention, or may be added as a complex.

The amount of the inhibitor present relative to the catalyst in the resin composition of the present invention can be adjusted to adjust the gel time of the resin composition. At constant levels of catalyst, an increasing amount of inhibitor will yield a corresponding increase in the gel time. At a desired catalyst level the relative amount of inhibitor can be decreased to decrease the gel time. To increase the gel time the amount of inhibitor can be increased without changing the catalyst level.

The molar ratio of inhibitor (or mixture of different inhibitors) to catalyst is that ratio which is sufficient to significantly inhibit the reaction of the resin as exhibited by an increase in gel time as compared to a like composition free of inhibitor. Simple experimentation can determine the particular levels of inhibitor or mixtures, which will increase in gel time but still allow a complete cure at elevated temperatures. For example, a preferable molar ratio range of inhibitor to catalyst, where up to 5.0 phr of boric acid is used, is from 0.1:1.0 to 10.0:1.0, with a more preferred range being from 0.4:1.0 to 7.0:1.0.

Another optional component, which may be added to the curable epoxy resin composition of the present invention, is a solvent or a blend of solvents. The solvent used in the resin composition is preferably miscible with the other components in the resin composition. In addition, the curable resin composition of the present invention may be a clear solution or a stable dispersion depending on the optional solvents used in the composition. Examples of suitable solvents employed in the present invention include, for example, ketones, ethers, acetates, aromatic hydrocarbons, cyclohexanone, dimethylformamide, glycol ethers, and combinations thereof.

Preferred solvents are polar solvents. Lower alcohols having from 1 to 20 carbon atoms, such as, for example, methanol, provide good solubility and volatility for removal from the resin matrix when a compound is formed.

Polar solvents are particularly useful to dissolve inhibitors of boric acid or Lewis acids derived from boron. If the polar solvents are hydroxy containing, there exists a potential competition for available carboxylic acid anhydride between the hydroxy moiety of the solvent and the secondary hydroxyl formed on opening of the oxirane ring. Thus, polar solvents which do not contain hydroxyl moieties are useful, for example, N,-methyl-2-pyrrolidone, dimethylsulfoxide, dimethylformamide, 2-butanone, acetone, and tetrahydrofuran. Also useful are dihydroxy and trihydroxy hydrocarbons optionally containing ether moieties or glycol ethers having two or three hydroxyl groups. Particularly useful are $C_{2-4}$ di- or trihydroxy compounds, for example, 1,2-propane diol, ethylene glycol and glycerine. The polyhydroxy functionality of the solvent facilitates the solvent serving as a chain extender, or as a co-cross-linker according to the possible mechanism previously described concerning co-cross-linkers.

The total amount of solvent used in the curable epoxy resin composition generally may be between 20 and 60 weight percent, preferably between 30 and 50 weight percent, and most preferably between 35 and 45 weight percent.

The curable epoxy resin composition according to the present invention may also contain additives such as fillers, dyes, pigments, thixotropic agents, surfactants, fluidity control agents, stabilizers, diluents that aid processing, adhesion promoters, flexibilizers, toughening agents, UV blocking, fluorescing agents, and fire retardants. The amount of the optional additives used in the epoxy resin composition generally may be from 0 weight percent to 70 weight percent depending on the final formulation.

In the preparation of the toughened blend or composition of the present invention, the components are mixed together by known means in the art at conditions to form a curable composition, preferably in liquid form. The curable epoxy resin composition of the present invention can be produced by mixing all the components of the composition together in any order.

Alternatively, the curable resin composition of the present invention can be produced by preparing a first composition comprising the epoxy resin component and block copolymer; and a second composition comprising the curing agent component. All other components useful in making the resin composition may be present in the same composition, or some may be present in the first composition, and some in the second composition. The first composition is then mixed with the second composition to form the curable resin composition. The curable resin composition mixture is then cured to produce an epoxy resin thermoset material. Preferably, the curable resin composition is in the form of a solution, wherein the components of the composition are dissolved in a solvent. Such solution or varnish is used for producing a laminate article.

As aforementioned, a neutral solvent may be employed in the blend to facilitate homogeneous mixing of the block copolymer, epoxy resin, curing catalyst and curing agent. The preferred optional solvent used in the present invention may include, for example, acetone and methyl ethyl ketone (MEK). In addition, other solvent choices can also be used as long as it dissolves all the components.

One embodiment of making the modified resin of the present invention includes incorporating the block copolymer directly into an epoxy resin advancement reactor during the resin manufacturing step. In this embodiment, the composition of the present invention includes, for example, the use of a liquid epoxy resin such as a diglycidyl ether of bisphenol-A, a polyhydric alcohol such as bisphenol-A and a block copolymer such as an EO/BO diblock copolymer.

If the processing of the epoxy resin includes an advancement step, another method of making the modified resin of the present invention includes adding the block copolymers to the reactants prior to the advancement reaction.

Still another alternative method of making the modified resin of the present invention includes incorporating the block copolymer into the curing agent used to cure the epoxy resin.

The block copolymer can be used in concentrations of from 0.5 w/w percent to 10 w/w percent based on the formulated solids content of the cured epoxy system used in the laminate application, preferably between 2 w/w percent and 6 w/w percent. The concentration of the block copolymer in the resin can be adjusted to provide the desired concentration in the final formulation or can be kept at higher concentration (masterbatch) and adjusted down with unmodified resin to desired final concentration.

Time and temperature of the process is not critical, but generally the components can be mixed at a temperature of from 10° C. to 60° C., preferably from 20° C. to 60° C. and more preferably from 25° C. to 40° C. for a sufficient time period until complete homogeneity is achieved.

The mixture of epoxy resin, curing agent, block co-polymer, curing catalyst and any other modifiers present in the composition can be cured according to typical processes practiced by the industry. The temperature of curing can range generally from 10° C. to 200° C. These processes include ambient temperature cure (for example, 20° C.) to elevated temperature cures (for example, from 100° C. to 200° C.) using thermal, radiation or a combination of energy sources.

As is generally known, the time of curing can range generally from seconds to several hours depending on the curing agent and the components in the resin composition. The time of curing can range generally, for example, from 30 minutes to 24 hours; preferably from 1 hour to 4 hours. The curable composition can be cured in one step or multiple steps or the curable composition can be post-cured using a different temperature or energy source after the initial cure cycle.

The curable epoxy resin composition containing the polyether block copolymers of the present invention may be used for preparing composites, prepregs or laminates.

Generally, the electrical laminates and other composites disclosed herein are made from a fibrous reinforcement and an epoxy-containing matrix resin modified with the block copolymers of the present invention. Examples of suitable processes may contain the following steps:

(1) An epoxy-containing formulation is applied to or impregnated into a substrate by rolling, dipping, spraying, or other known techniques and/or combinations thereof. The substrate is typically a woven or nonwoven fiber mat containing, for instance, glass fibers or paper.

(2) The impregnated substrate is "B-staged" by heating at a temperature sufficient to draw off solvent in the epoxy formulation and optionally to partially cure the epoxy formulation, so that the impregnated substrate can be handled easily. The "B-staging" step is usually carried out at a temperature of from 90° C. to 210° C. and for a time of from 1 minute to 15 minutes. The impregnated substrate that results from B-staging is called a "prepreg." The temperature is most commonly 100° C. for composites and 130° C. to 200° C. for electrical laminates.

(3) One or more sheets of prepreg are stacked or laid up in alternating layers with one or more sheets of a conductive material, such as copper foil, if an electrical laminate is desired.

(4) The laid-up sheets are pressed at high temperature and pressure for a time sufficient to cure the resin and form a laminate. The temperature of this lamination step is usually between 100° C. and 230° C., and is most often between 165° C. and 190° C. The lamination step may also be carried out in two or more stages, such as a first stage between 100° C. and 150° C. and a second stage at between 165° C. and 190° C. The pressure is usually between 50 N/cm² and 500 N/cm². The lamination step is usually carried out for a time of from 1 minute to 200 minutes, and most often for 45 minutes to 90 minutes. The lamination step may optionally be carried out at higher temperatures for shorter times (such as in continuous lamination processes) or for longer times at lower temperatures (such as in low energy press processes).

(5) Optionally, the resulting laminate, for example, a copper-clad laminate, may be post-treated by heating for a time at high temperature and ambient pressure. The temperature of post-treatment is usually between 120° C. and 250° C. The post-treatment time usually is between 30 minutes and 12 hours.

The following working examples are given to illustrate the invention and should not be construed as limiting its scope. Unless otherwise indicated, all parts and percentages are by weight.

Some of the raw materials used in the Examples are as follows:

An epoxy bisphenol novolac resin (E-BPAN) with an EEW around 215.

A 3.6 functional epoxy novolac resin (ENR) with an EEW around 180 in acetone solvent (85 percent solids).

A brominated epoxy resin (BER) with an EEW around 455 and a bromine content of 50 percent.

DOWANOL*PMA is a propylene glycol monomethyl ether acetate solvent, commercially available from The Dow Chemical Company.

DOWANOL*PM is a propylene glycol monomethyl ether solvent, commercially available from The Dow Chemical Company. Acetone is a solvent.

"PEO-PBO-PEO" stands for a poly(ethylene oxide)-poly(butylenes oxide)-poly(ethylene oxide) triblock copolymer toughening agent.

"PEO-PBO" stands for a poly(ethylene oxide)-poly(butylene oxide) diblock copolymer toughening agent. "PN" is a designation for a phenolic curing agent (50 percent solids in DOWANOL*PMA) with a hydroxyl equivalent weight of 104.

"2MI" stands for 2-methyl imidazole.

"2MI Solution" stands for 2-methyl imidazole catalyst (10 percent solids in dimethylformamide (DMF)).

"DMF" stands for dimethylformamide.

Trademark of The Dow Chemical Company

PREPARATORY EXAMPLE A

Preparation PEO-PBO Diblock Copolymer

Part A: Preparation of Catalyzed Initiator

Diethylene glycol monomethyl ether (979.1 grams; 8.16 moles) and potassium hydroxide (29.84 grams; 85 weight percent) were combined in a closed system reaction vessel. The resultant mixture was heated to 110° C. and stripped under vacuum to remove the water (<500 ppm) formed in the reaction.

Part B: Preparation of butylene oxide polymer

Catalyzed initiator (123.9 grams; approximately one mole of diethylene glycol monomethyl ether) prepared in Part A above was heated to 120° C. Butylene oxide (BO) (5355 grams; 74.38 moles) was slowly fed into the reactor such that the reaction temperature was maintained at 120° C. After addition of the BO to the reactor was complete, the mixture was digested until the pressure in the reactor no longer decreased. A portion of the reaction mixture was removed leaving 3052 grams of product in the reactor. More BO (1585 grams; 22.01 moles) was slowly added at a rate which maintained the reaction temperature at 120° C. When addition of the BO to the reactor was complete, the mixture was again digested until the pressure leveled off.

Part C: Preparation of Final butylene oxide-ethylene oxide block copolymer

Ethylene oxide (EO) (1830 grams; 41.59) was slowly added to the butylene oxide block polymer (4016 grams) prepared in Part B above such that the reaction temperature was maintained at 120° C. When addition of the EO to the reactor was complete, the mixture was digested until the pressure leveled off. Enough glacial acetic acid was then added to the mixture to bring the pH of the mixture to 6-7 (ASTM E70-90). The product was then transferred via a transfer line to a storage container while maintaining the product temperature above 50° C. to prevent solidification of the product in the transfer line. The final product, PEO-PBO block copolymer, had a number average molecular weight of 5397 as determined by titration of the polymer OH end groups (ASTM D 4274-94, Method D).

PREPARATORY EXAMPLE B

Preparation of PEO-PBO-PEO Triblock Copolymer

The basic procedure used to make the PEO-PBO diblock copolymer used in Preparatory Example A above was used in this example to make a PEO-PBO-PEO triblock copolymer except for the following changes. The final PEO-PBO-PEO product contained the following molar ratio of initiator/monomers:

1 mole propylene glycol/56 moles butylene oxide/62 moles of ethylene oxide

Part A: Preparation of Catalyzed Initiator

Propylene glycol was used in place of DOWANOL PM. In addition, an aqueous solution of KOH (46 weight percent solids) was used. The aqueous KOH was added to the reactor in an amount to give a final catalyst concentration of 9 weight percent. The water was not removed from the reaction product.

Part B: Preparation of butylene oxide polymer

Butylene oxide was added in two batches. The amount of BO was adjusted so that an intermediate butylene oxide block had a number average molecular weight (Mn) of approximately 1000. When digestion was complete more of the aqueous KOH (46 weight percent) was added to the reactor so that the final catalyst concentration was approximately one weight percent. The water was removed from the reaction product under vacuum; then additional BO was added to the reactor to give the final butylene oxide polymer. The final butylene oxide polymer had a number average molecular weight of approximately 3500.

Part C: Preparation of final PEO-PBO-PEO triblock copolymer

In order to obtain a liquid product, a mixture of ethylene oxide and butylene oxide (80/20 weight percent) was added to the butylene oxide prepared in Part B above. The incorporation of a small amount of butylene oxide in this step helps to disrupt the tendency of PEO to crystallize and form a solid. The amount of the added mixture was adjusted so that the final triblock had a number average molecular weight of approximately 6800 g/mole. The final reaction mixture was cooled to 60° C. and then neutralized through a magnesium silicate bed to give the final PEO-PBO-PEO triblock copolymer.

EXAMPLES 1 AND 2 AND COMPARATIVE EXAMPLE A

Part A: Preparation of Toughened Epoxy Solution

A toughened epoxy solution was prepared as follows: ENR solution (85 percent solids in acetone), BER, E-BPAN, DOWANOL*PMA, DOWANOL*PM, and acetone were blended at room temperature (25° C.) to form an epoxy resin mixture. Then, a toughening agent, either a PEO-PBO-PEO (Example 1) or PEO-PBO (Example 2), was added to the resin mixture. One mixture had no toughening agent and was used as a control (Comparative Example A). The amounts of the materials used in this example are shown in Table 1 below.

TABLE 1

| Epoxy Resin Solution | Comparative Example A (Control) (g) | Example 1 PEO-PBO-PEO (g) | Example 2 (PEO-PBO) (g) |
|---|---|---|---|
| Components | | | |
| E-BPAN | 826.2 | 763.5 | 763.6 |
| ENR | 972.7 | 898.6 | 898.8 |
| BER | 1258.4 | 1259.8 | 1258.4 |
| DOWANOL*PMA | 321.8 | 431.4 | 433.6 |
| DOWANOL*PM | 95.7 | 129.1 | 128.9 |
| Acetone | 329.9 | 459.0 | 463.6 |
| PEO-PBO-PEO | | 190.5 | |
| PEO-PBO | | | 190.54 |
| percent solids | 66.94 | 64.7 | 64.7 |

Part B: Preparation of Electrical Laminate Varnish

A varnish solution was prepared by mixing the following components in the amounts indicated in Table 2 below. The solution was mixed for one hour at room temperature.

TABLE 2

| Varnish Solution | Comparative Example A (Control) | Example 1 (PEO-PBO-PEO) | Example 2 (PEO-PBO) |
|---|---|---|---|
| Components | | | |
| Toughened Epoxy Solution (as described in Part A above) | 3684.0 | 4090.0 | 4099.0 |
| PN (50 percent solids in DOWANOL* PMA) | 2081.1 | 2001.0 | 2005.6 |
| 2MI Solution (10 percent solids in DMF) | 14.07 | 14.89 | 14.63 |
| Acetone | 497.0 | 510.0 | 500.0 |
| Properties | | | |
| Reactivity (seconds) | 240 | 272 | 265 |

The 2MI Solution was prepared by blending 2MI at a 10 percent solids level in DMF (dimethylformamide).

To measure the reactivity of the resulting resin varnish solution, a 10 g sample of the resin solution was placed on the surface of a hot plate at 171° C. The reactivity measurement of the resin solution is reported in Table 2 as elapsed time in seconds required for gelation.

Part C: Preparation of Prepreg

Prepregs were prepared by placing the varnish solution formulations prepared in Part B above, into a pan and then dipping a glass cloth (type 7628 woven glass with a CS 718 finish commercially available from Hexcel Schwebel) into the solution. The resulting impregnated substrates were then passed through a vertical Litzler™ pilot treater (30 feet [914 cm] of heated oven space at 350° F. [177° C.] and a glass web speed of 10 feet/minute [305 cm/minute]). The resin content of each prepreg was measured by weighing 10 cm×10 cm square sheets of glass cloth before and after prepreg production, according to Method IPC-L-109B, IPC-TM-650:2.3.16 (available from the Institute for Interconnecting and Packaging Electronic Circuits, Lincolnwood, Ill., USA.). The difference in weight or the resin pick up weight divided by the glass cloth weight is the weight percent of the resin content.

Part D: Preparation of Laminates

Eight sheets of each prepreg prepared in Part C above were laid-up in alternating layers with sheets of copper foil (Gould Grade 3) on the outer layers. To form a laminate, the resulting laid-up multilayer prepreg was placed between two stainless steel plates, inserted into a PHI Hydraulic Press (Model SBR 233C) and pressed utilizing the press schedule below:

Temperature Ramp: 6 deg° F./min (10.8° C./minute) to 374° F. (190° C.)

Hold Time: 90 minutes

Pressure: 115 psi

TABLE 3

Test Procedures and Results

| TEST | Comparative Example A (Control) | Example 1 (PEO-PBO-PEO) | Example 2 (PEO-PBO) |
|---|---|---|---|
| Pre-preg Stability[1] [Stickiness, 40° C. for 5 days] | Non sticky | Non sticky | Non sticky |
| Dust Formation[2] (percent) | 5 | 2.06 | 1.70 |
| Pre-Preg Appearance[3] | Yellow, smooth | Dark yellow, extremely rough | Yellow, slight roughness |
| Tg[4] [° C., DMTA] | 174 | 171 | 169 |
| Td[5] [° C., 5 percent wt loss] | 349.54 | 361.95 | 362.15 |
| T260[6] [minutes] | >90 | >90 | >90 |
| HPCT[7] [percent Moisture Pickup after 1 hour | 0.12 percent | 0.17 percent | 0.16 percent |
| $G_{1C}$[8] | 0.287 | 0.339 | 0.377 |

Notes for Table 3
[1]Prepreg Stability: Two cured 5 inches × 5 inches (12.7 cm × 12.7 cm) prepregs are stacked together and placed under a steel plate (approximately 2 kg) and left in an oven at 40° C. for 5 days. If the prepreg layers stick together after this time, the layers are classified as "sticky." If the layers do not stick together after this time, the layers are classified as "non-sticky."
[2]Dust Formation: A 5 inches × 5 inches (12.7 cm × 12.7 cm) piece of prepreg is weighed and then cut in to 0.5 inch strips and the strips are weighed. The difference in weight is used to calculate the percent (percent) dust formation.
[3]Prepreg Appearance: A visual description of the surface and color of the prepreg is carried out.
[4]Tg—glass transition temperature is measured by dynamic mechanical thermal analysis (DMTA) in accordance with ASTM D-4065.
[5]Td—thermal decomposition is measured by thermogravimetric analysis (TGA Model 2950)—temperature at which 5 wt percent is lost
[6]T-260—time to delamination is measured by thermomechanical analysis (TMA)
[7]"HPCT" stands for High Pressure Cooker Test. In the HPCT a laminate is exposed to 15 psi saturated steam for 1 hour and then weighed. The weight difference before and after moisture exposure is used to calculate percent moisture pickup.
[8]$G_{1c}$—fracture toughness test is performed on a 16 ply laminate in accordance with ASTM D5528.

The higher $G_{1c}$ values combined with practically unchanged Tg, Td, and T-260 values, as shown in Table 3 above, demonstrates that the resin of Examples 1 and 2 were indeed toughened and the thermal properties were not sacrificed. The results of these Examples also indicates that the toughening agents truly toughened the laminate and did not simply act as a plasticizer.

What is claimed is:

1. A curable laminate epoxy resin varnish composition comprising
    (a) an epoxy resin;
    (b) an amphiphilic block copolymer containing at least one epoxy resin miscible block segment and at least one epoxy resin immiscible block segment; wherein the immiscible block segment comprises at least one polyether structure; wherein the miscible block segment comprises at least one polyether structure; and wherein the composition of the amphiphilic block copolymer ranges from 90 percent epoxy resin miscible segments of the amphiphilic block copolymer and 10 percent epoxy resin immiscible segments of the amphiphilic block copolymer to 10 percent epoxy resin miscible segments of the amphiphilic block copolymer and 90 percent epoxy resin immiscible segments of the amphiphilic block copolymer; such that when the epoxy resin composition is cured, the toughness, $G_{1c}$, as measured by the fracture toughness test ASTM D5528, of the resulting cured laminate epoxy resin composition having the amphiphilic block copolymer is increased by a factor of 1.5 times to 2.5 times that of a cured laminate epoxy resin composition without the amphiphilic block copolymer;
    (c) a curing agent;
    (d) a curing catalyst; and
    (e) a solvent.

2. The composition of claim 1 wherein the amphiphilic block copolymer is an amphiphilic polyether block copolymer containing at least one epoxy resin immiscible block segment; wherein the immiscible block segment comprises at least one polyether structure provided that the polyether structure of said immiscible block segment contains at least one or more alkylene oxide monomer units having at least four carbon atoms.

3. The composition of claim 1 wherein the amphiphilic polyether block copolymer is selected from the group consisting of a diblock, a linear triblock, a linear tetrablock, a multiblock structure; a branched block structure; or a star block structure.

4. The composition of claim 1 wherein the miscible block segment contains a polyethylene oxide block, a propylene oxide block, or a poly(ethylene oxide-co-propylene oxide) block; and the immiscible block segment contains a polybutylene oxide block, a polyhexalene oxide block, or a polydodecalene oxide block.

5. The composition of claim 1 wherein the at least one of the miscible segments of the amphiphilic block copolymer is a poly(ethylene oxide); and the at least one of the immiscible segments of the amphiphilic block copolymer is a poly(butylene oxide).

6. The composition of claim 1 wherein the amphiphilic block copolymer is poly(ethylene oxide)-poly(butylene oxide) or poly(ethylene oxide)-poly(butylene oxide)-poly(ethylene oxide).

7. The composition of claim 1 wherein the amphiphilic block copolymer has a molecular weight of from 1000 to 30,000.

8. The composition of claim 1 wherein the amphiphilic block copolymer is present in an amount of from 0.1 weight percent to 30 weight percent based on the weight of the composition.

9. The composition of claim 1 wherein the epoxy resin is selected from the group consisting of polyglycidyl ethers of polyhydric alcohols, polyglycidyl ethers of polyhydric phenols, polyglycidyl amines, polyglycidyl amides, polyglycidyl imides, polyglycidyl hydantoins, polyglycidyl thioethers, epoxidized fatty acids, epoxidized drying oils, epoxidized polyolefins, epoxidized di-unsaturated acid esters, epoxidized unsaturated polyesters, and mixtures thereof.

10. The composition of claim 1 wherein the epoxy resin is a glycidyl polyether of a polyhydric alcohol or a glycidyl polyether of a polyhydric phenol.

11. The composition of claim 1 wherein the epoxy resin is selected from the group consisting of 3,4-epoxycyclohexylmethyl-3,4-epoxycyclohexyl carboxylate; 1,2-epoxy-4-vinylcyclohexane; bis(7-oxabicyclo[4.1.0]hept-3-ylmethyl hexanedioic acid ester; 3,4-epoxycyclohexanecarboxylate methyl ester; and mixtures thereof.

12. The composition of claim 1 including a homopolymer of identical composition to the epoxy immiscible block segment.

13. The composition of claim 1 including a homopolymer of identical composition to the epoxy miscible block segment.

14. The composition of claim 1 wherein the epoxy resin has an epoxide equivalent weight of from 150 to 3000.

15. The composition of claim 1 having flame retardant properties.

16. The composition of claim 1 wherein the epoxy resin is a brominated epoxy resin.

17. The composition of claim 1 wherein the epoxy resin is a phosphorous element-containing epoxy resin.

18. A process for preparing a curable laminate epoxy resin varnish composition comprising mixing
    (a) an epoxy resin;
    (b) an amphiphilic block copolymer containing at least one epoxy resin miscible block segment and at least one epoxy resin immiscible block segment; wherein the immiscible block segment comprises at least one polyether structure provided that the polyether structure of said immiscible block segment contains at least one or more alkylene oxide monomer units having at least four carbon atoms; wherein the miscible block segment comprises at least one polyether structure; and wherein the composition of the amphiphilic block copolymer ranges from 90 percent epoxy resin miscible segments of the amphiphilic block copolymer and 10 percent epoxy resin immiscible segments of the amphiphilic block copolymer to 10 percent epoxy resin miscible segments of the amphiphilic block copolymer and 90 percent epoxy resin immiscible segments of the amphiphilic block copolymer; such that when the epoxy resin composition is cured, the toughness, $G_{1c}$, as measured by the fracture toughness test ASTM D5528, of the resulting cured epoxy resin composition is increased by a factor of 1.5 times to 2.5 times that of a cured laminate epoxy resin composition without the amphiphilic block copolymer;
(c) a curing agent;
(d) a curing catalyst; and
(e) a solvent.

19. A process for preparing a laminate comprising:
(I) impregnating a reinforcing substrate with a curable laminate composition comprising the curable composition of claim 1; and
(II) heating the impregnated substrate with the curable composition of claim 1 at a temperature sufficient to cure the laminate composition.

20. The process of claim 19 wherein the reinforcing substrate is a woven cloth of glass fibers.

21. A laminate made by the process of claim 19.

22. A prepreg made by the process of claim 19.

* * * * *